United States Patent
Jeon

(10) Patent No.: US 7,678,643 B2
(45) Date of Patent: Mar. 16, 2010

(54) METHOD FOR MANUFACTURING A CMOS IMAGE SENSOR

(75) Inventor: In Gyun Jeon, Gunpo-si (KR)

(73) Assignee: Dongbu Electronics Co., Ltd., Seoul (KR)

( * ) Notice: Subject to any disclaimer, the term of this patent is extended or adjusted under 35 U.S.C. 154(b) by 204 days.

(21) Appl. No.: 11/528,178

(22) Filed: Sep. 26, 2006

(65) Prior Publication Data

US 2007/0069322 A1   Mar. 29, 2007

(30) Foreign Application Priority Data

Sep. 28, 2005   (KR)   .................... 10-2005-0090261

(51) Int. Cl.
*H01L 21/8238*   (2006.01)
*H01L 31/062*   (2006.01)
(52) U.S. Cl. .................... 438/237; 438/73; 257/292; 257/462; 257/E27.133
(58) Field of Classification Search ................ 438/237, 438/73; 257/292, 462, E27.133
See application file for complete search history.

(56) References Cited

U.S. PATENT DOCUMENTS 7,115,925 B2 * 10/2006 Rhodes ....................... 257/292

2004/0217436 A1 * 11/2004 Kimura ....................... 257/461
2004/0251482 A1 * 12/2004 Rhodes ....................... 257/292

FOREIGN PATENT DOCUMENTS

CN   1490879   4/2004

* cited by examiner

*Primary Examiner*—Steven J Fulk
(74) *Attorney, Agent, or Firm*—Saliwanchik, Lloyd & Saliwanchik

(57) ABSTRACT

Provided is a CMOS image sensor and method of manufacturing same. The CMOS image sensor includes a photodiode, a transfer transistor, a reset transistor, a drive transistor, and a select transistor. A device isolation layer is formed on a first conductive type substrate. Gate electrodes of the transfer transistor, the reset transistor, the drive transistor, and the select transistor are formed on an active region of the substrate with gate insulating layers interposed therebetween. A first diffusion region is formed of a second conductive type in a first region of the active region, where the first region does not include a floating diffusion region between the transfer transistor and the reset transistor and the photodiode region. A second diffusion region is formed of the second conductive type in the floating diffusion region at a concentration lower than that of the second conductive type first diffusion region.

10 Claims, 7 Drawing Sheets

METHOD FOR MANUFACTURING A CMOS IMAGE SENSOR

RELATED APPLICATION

This application claims the benefit under 35 U.S.C. § 119 (e), of Korean Patent Application Number 10-2005-0090261 filed Sep. 28, 2005, which is incorporated herein by reference in its entirety.

FIELD OF THE INVENTION

The present invention relates to a CMOS image sensor and a method for manufacturing the same.

BACKGROUND OF THE INVENTION

In general, an image sensor is a semiconductor device for converting an optical image into an electrical signal. Image sensors are generally classified into charge coupled devices (CCDs) or complementary metal oxide silicon (CMOS) image sensors (CISs).

A CMOS image sensor includes a photodiode and a MOS transistor formed in a unit pixel, and can display an image by sequentially detecting an electrical signal in each unit pixel using a switching method.

The CMOS image sensors are classified into 3T type, 4T type, 5T type and the like according to the number of transistors in a unit pixel. The 3T type CMOS image sensor includes one photodiode and three transistors, and the 4T type CMOS image sensor includes one photodiode and four transistors.

FIG. 1 is a layout of a unit pixel of a 4T type CMOS image sensor according to the related art, and FIG. 2 is a sectional view taken along the line II-II' of FIG. 1.

Referring to FIGS. 1 and 2, in a 4T type CMOS image sensor according to the related art, a P-well region 32 is formed in a semiconductor substrate 31 in which an active region and a device isolation region are defined. A device isolation layer 34 is formed on the device isolation region of the semiconductor substrate 31.

Gate electrodes 23, 33, 43, and 53 of four transistors are formed on the active region of the semiconductor substrate 31 isolated by the device isolation layer 34.

The gate electrodes 23, 33, 43, and 53 of the four transistors include the transfer transistor gate electrode 23, the reset transistor gate electrode 33, the drive transistor gate electrode 43 and the select transistor gate electrode 53.

A photodiode 'PD' 60 is formed at one side of the gate electrode 23 of the transfer transistor.

Herein, a n+ diffusion region 36, i.e., source/drain region, is formed in the active region of each transistor by implanting to the same depth n+ impurity ions at high concentration into the active region of each transistor except in the photodiode 'PD' 60 and a portion below each of the transistors 23, 33, 43, and 53.

The gate electrode 33 of FIG. 2 is the gate electrode 33 of the reset transistor, and the n+ diffusion region 36 between the gate electrode 23 of the transfer transistor and the gate electrode 33 of the reset transistor is a floating diffusion region 'FD'.

Non-described bold solid line 'L' indicates a connection line connecting the floating diffusion region 'FD' and the drive transistor gate electrode 43.

In the related art CMOS image sensor, the n+ diffusion region 36 for each transistor is formed in the entire active region (i.e., uniform dashed line portion) except for the photodiode 'PD' region by the same ion implantation process in all peripheral circuits (remaining device region except for the pixel array).

In the related art CMOS image sensor, since the n+ diffusion regions 36 have the same ion implantation concentration, they have the same leakage current and the same junction capacitance per unit area.

Accordingly, in the CMOS image sensor having four transistors and one photodiode, it is very important to reduce the junction leakage in the floating diffusion region. This is because the potential of the floating diffusion region serves as a direct input potential of the drive transistor.

However, according to the related art, since the junction leakage of the floating diffusion region has the same value per unit area in input node 'Vin', output node 'Vout', and the peripheral circuit, the floating diffusion region fails to perform its true function.

In other words, the true function of the floating diffusion region is to preserve a small amount of electrons diffused from the photodiode without any change. However, if such electrons are lost due to leakage, the floating diffusion region fails to perform its true function, so that the characteristics of the CMOS image sensor are deteriorated.

In the case of the related art CMOS image sensors; the 3T CMOS image sensor has a similar problem to the 4T CMOS image sensor.

That is, in the 3T type CMOS image sensor, the potential of a region between the photodiode region and the gate electrode of the reset transistor serves as a direct input potential of the drive transistor, and the junction leakage between the photodiode region and the gate electrode of the reset transistor has the same value per unit area in the input node 'Vin', the output node 'Vout', and the peripheral circuit. Accordingly, leakage loss occurs.

BRIEF SUMMARY OF THE INVENTION

Accordingly, the present invention is directed to a CMOS image sensor and method for manufacturing the same that addresses and/or substantially obviates one or more problems, limitations, and/or disadvantages of the related art.

An object of the present invention is to provide a 4T type CMOS image sensor and a method for manufacturing the same in which the concentration of impurity ions implanted into the floating diffusion region is made different than the concentration of impurity ions implanted into a source/drain region of other transistors to reduce the leakage current in the floating diffusion region, thereby enhancing the characteristics of the image sensor.

Another object of the present invention is to provide a 3T type CMOS image sensor and a method for manufacturing the same that can decrease the leakage current in a region between a photodiode and a reset transistor.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages and in accordance with the purpose of the invention, as embodied and broadly described herein, there is provided a CMOS image sensor having a photodiode, a transfer transistor, a reset transistor, a drive transistor and a select transistor, the CMOS image sensor including: a device isolation layer formed on a device isolation region of a first conductive type substrate in which an active region and the device isolation region are defined; gate electrodes of the transfer transistor, the reset transistor, the drive transistor, and the select transistor formed on the active region with gate insulating layers interposed therebetween; a first diffusion region formed of a second conductive type in a first region of the active region, where the first region does not include both a floating diffusion region (between the transfer transistor and the reset transistor) and the photodiode region; and a second diffusion region formed of the second conductive type in the floating diffusion region at a concentration lower than that of the first diffusion region.

In another aspect of the present invention, there is provided a method for manufacturing a CMOS image sensor having a photodiode, a transfer transistor, a reset transistor, a drive transistor, and a select transistor, the method including: forming a device isolation layer on a device isolation region of a first conductive type substrate in which an active region and the device isolation region are defined; forming gate electrodes for each of the transfer transistor, the reset transistor, the drive transistor, and the select transistor on the active region with gate insulating layers interposed therebetween; forming a first diffusion region of a second conductive type in a first region of the active region, where the first region does not include both a floating diffusion region (between the transfer transistor and the reset transistor) and the photodiode region; and forming a second diffusion region of the second conductive type in the floating diffusion region by implanting impurity ions into the floating diffusion region at a concentration lower than that of the first diffusion region.

In a further another aspect of the present invention, there is provided a CMOS image sensor having a photodiode, a reset transistor, a drive transistor, and a select transistor, the CMOS image sensor including: a device isolation layer formed on a device isolation region of a first conductive type substrate in which an active region and the device isolation region are defined; gate electrodes of the reset transistor, the drive transistor, and the select transistor formed on the active region with gate insulating layers interposed therebetween; a first diffusion region formed of a second conductive type in a first region of the active region, where the first region does not include both a second region (between the reset transistor and the photodiode) and the photodiode region; and a second diffusion region formed of the second conductive type in the first region at a concentration lower than that of the first diffusion region.

In a still another aspect of the present invention, there is provided a method for manufacturing a CMOS image sensor having a photodiode, a reset transistor, a drive transistor and a select transistor, the method including: forming a device isolation layer on a device isolation region of a first conductive type substrate in which an active region and the device isolation region are defined; forming gate electrodes for the reset transistor, the drive transistor, and the select transistor on the active region with gate insulating layers interposed therebetween; forming a first diffusion region of a second conductive type in a first region of the active region, where the first region does not include both a second region (between the reset transistor and the photodiode) and the photodiode region; and forming a second diffusion region of the second conductive type in the second region by implanting impurity ions into the second region at a concentration lower than that of the first diffusion region.

It is to be understood that both the foregoing general description and the following detailed description of the present invention are exemplary and explanatory and are intended to provide further explanation of the invention as claimed.

DETAILED DESCRIPTION OF THE INVENTION

Reference will be made in detail to the preferred embodiments of the present invention, examples of which are illustrated in the accompanying drawings.

First Embodiment

Figure 1:
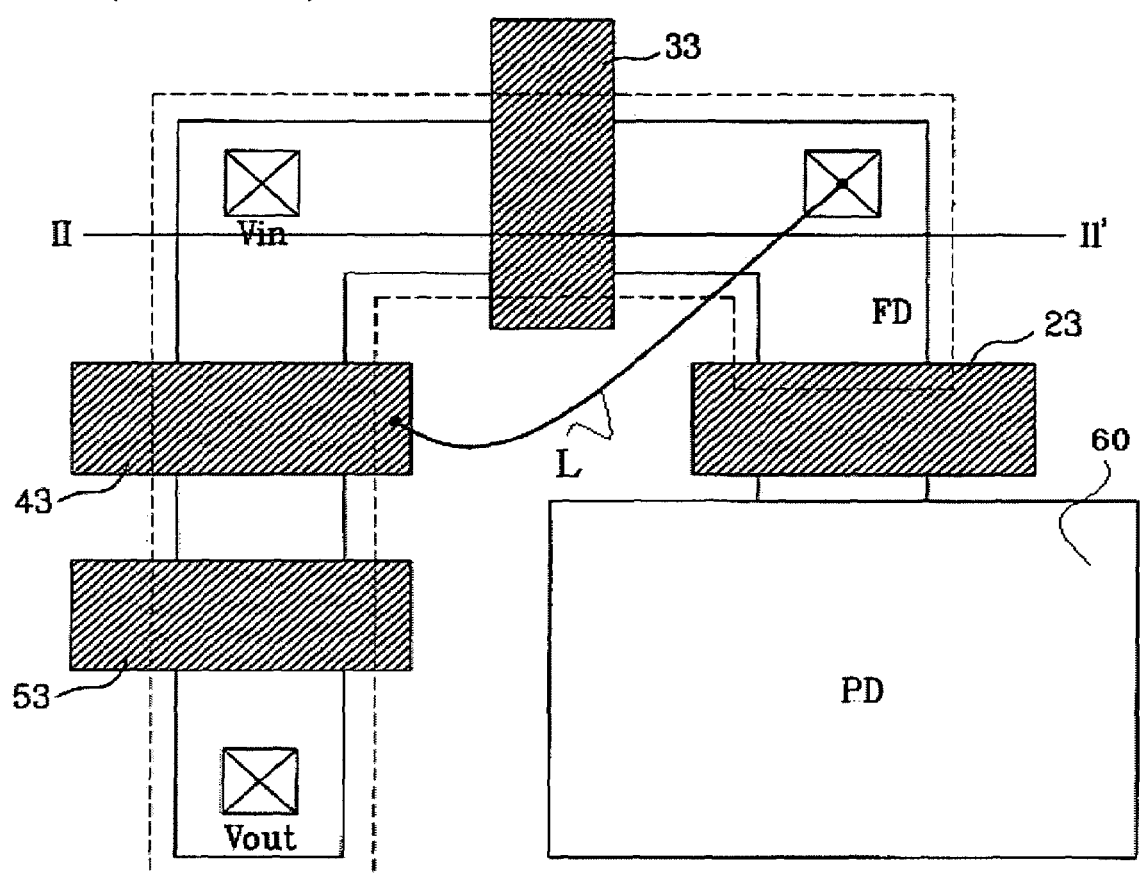
FIG. 1 is a layout of a unit pixel of a 4T type CMOS image sensor according to the related art.
Figure 2:
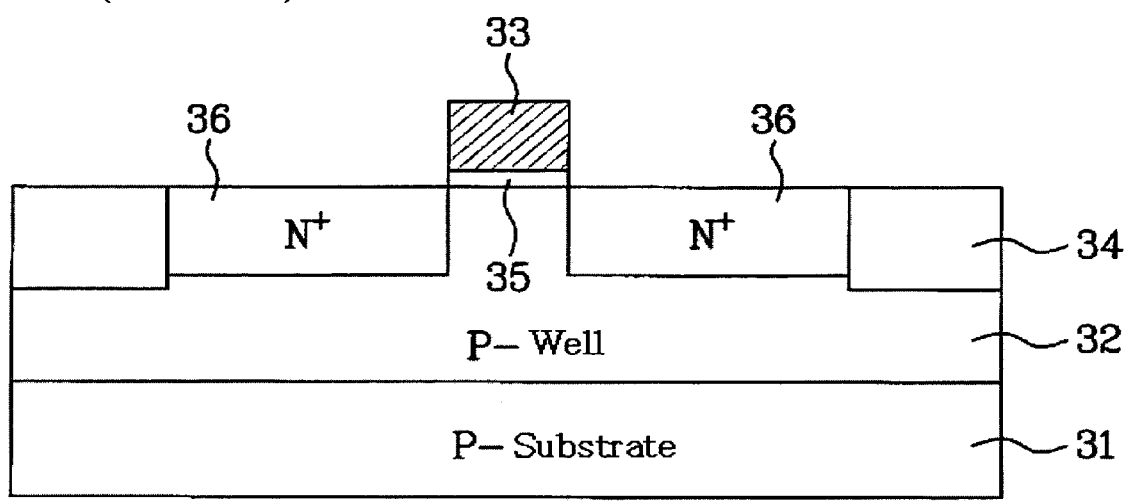
FIG. 2 is a sectional view taken along the line II-II' of FIG. 1.
Figure 3:
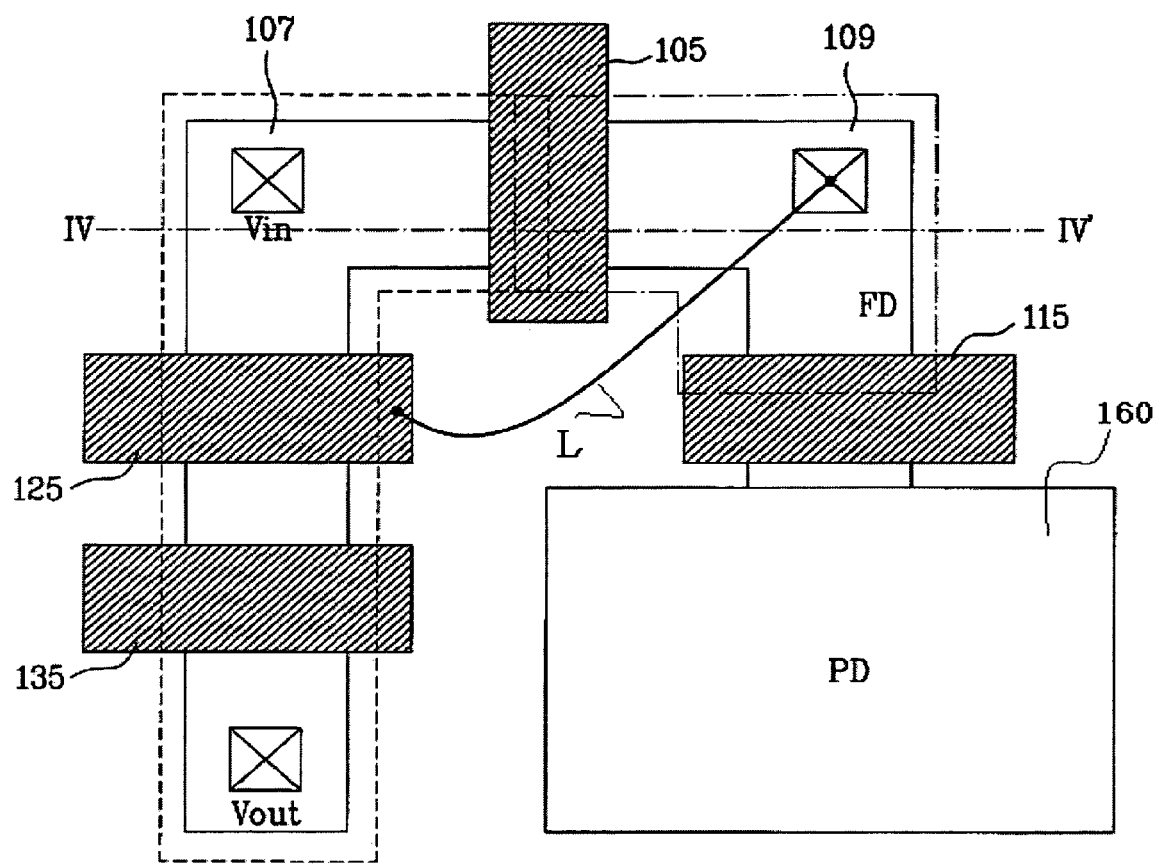
FIG. 3 is a layout of a unit pixel of a 4T type CMOS image sensor according to a first embodiment of the present invention.
Figure 4:
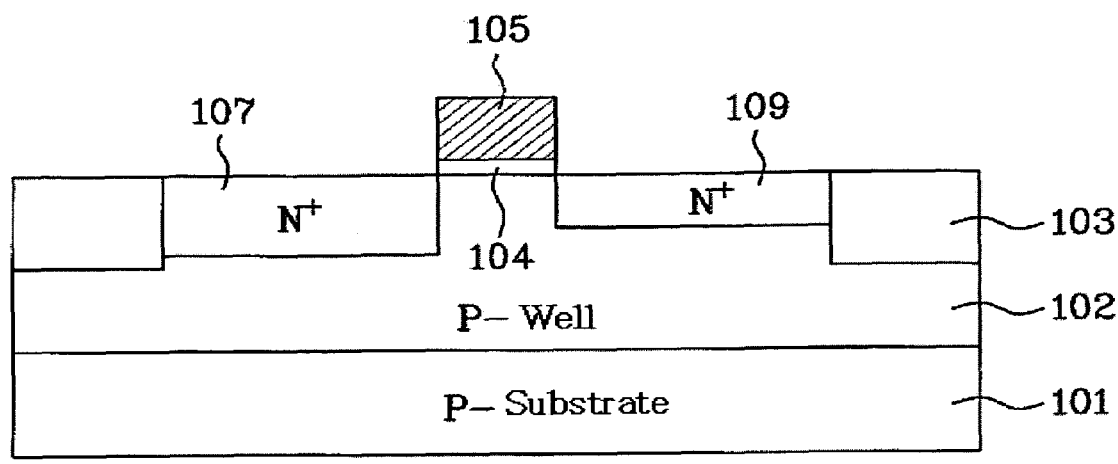
FIG. 4 is a sectional view taken along the line IV-IV' of FIG. 3.

FIG. 3 is a layout of a unit pixel of a 4T type CMOS image sensor according to a first embodiment of the present invention, and FIG. 4 is a sectional view taken along the line IV-IV' of FIG. 3.

Referring to FIGS. 3 and 4, a P-well region 102 can be formed in a surface of a P-type semiconductor substrate 101 in which an active region and a device isolation region are defined, and a device isolation layer 103 can be formed on the device isolation region of the semiconductor substrate 101.

In a specific embodiment, the P-well region 102 can be formed at a concentration range of $1E17/cm^3 \sim 1E18/cm^3$.

Four gate electrodes 105, 115, 125, and 135 can be formed on the active region of the semiconductor substrate 101 isolated by the device isolation layer 103 with gate insulating layers 104 interposed therebetween.

The gate electrodes of the four transistors include the reset transistor gate electrode 105, the transfer transistor gate electrode 115, the drive transistor gate electrode 125 and the select transistor gate electrode 135.

A second conductive type first diffusion region 107 can be formed on a first region of the active region. The first diffusion region 107 is not formed on a floating diffusion region 'FD' between the transfer transistor and the reset transistor. The first diffusion region 107 is also not formed on the photodiode 'PD' region.

That is, the second conductive type first diffusion region 107 can be formed in the active region at one side of the gate electrode 105 of the reset transistor and at both sides of the gate electrode 125 of the drive transistor and the gate electrode 135 of the select transistor. In one embodiment, the second conductive type first diffusion region 107 can be a first n+ diffusion region 107. In FIG. 3, a uniformly dashed line indicates where the first n+ diffusion region 107 can be formed.

In a specific embodiment, the second conductive type first diffusion region 107 can be formed at a concentration range of $1E20/cm^3 \sim 1E22/cm^3$.

A second conductive type second diffusion region 109 can be formed by implanting ions in the floating diffusion region 'FD' at a concentration lower than that of the second conductive type first diffusion region 107.

That is, the second conductive type second diffusion region 109 can be formed at the other side of the gate electrode 105 of the reset transistor at a concentration lower than that of the second conductive type first diffusion region 107. In one embodiment, the second conductive type second diffusion region 109 can be a second n+ diffusion region 109. In FIG. 3, a dashed dotted line indicates a region where the second n+ diffusion region 109 can be formed.

In a specific embodiment, the second conductive type second diffusion region 109 can be formed at a concentration range of $1E18/cm^3$ to $1E20/cm^3$.

Next, a photodiode region 'PD' can be formed at one side of the gate electrode 115 of the transfer transistor.

The gate electrode 105 shown in FIG. 4 is the gate electrode of the reset transistor. The second n+ diffusion region 109 can be formed in the active region between the gate electrode 115 of the transfer transistor and the gate electrode 105 of the reset transistor. The second n+ diffusion region 109 corresponds to the floating diffusion region 'FD'.

Non-described bold solid line indicates a connection line connecting the floating diffusion region 'FD' and the drive transistor.

The 4T type CMOS image sensor according to the first embodiment of the present invention is characterized in that the impurity concentration of the first n+ diffusion region 107 used as the source/drain region of the transistor is different from that of the second n+ diffusion region (i.e., floating diffusion region) 109.

That is, the concentration of the first n+ diffusion region 107 formed at one side of the gate electrode 105 of the reset transistor in FIG. 4 is made different from that of the second n+ diffusion region 109 formed at the other side of the gate electrode 105, while the impurity concentration of the first n+ diffusion region 107 is made the same as that for both sides of the gate electrodes of the remaining transistors.

Accordingly, in the 4T type CMOS image sensor as described in the above embodiments, the concentration of the impurity ions in the floating diffusion region used as the common source or drain region for the reset transistor and the transfer transistor is made lower than that in the other transistors, thereby decreasing the leakage current in the floating diffusion region to enhance the characteristic of the image sensor.

FIGS. 5 through 8 are sectional views of the 4T type CMOS image sensor according to the first embodiment of the present invention.

Figure 5:
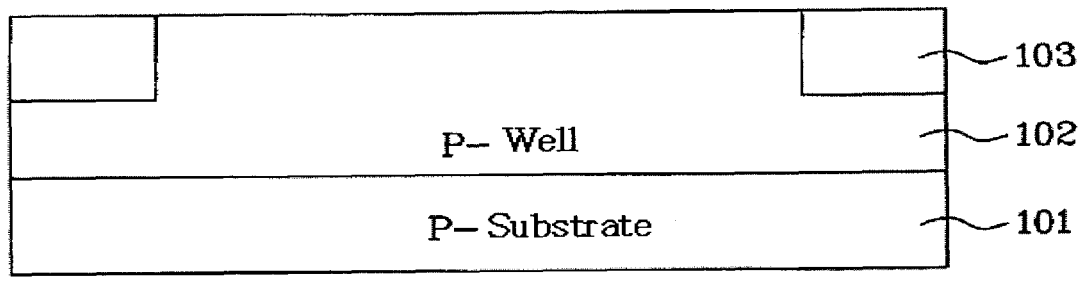
FIGS. 5 through 8 are sectional views illustrating a method for manufacturing a 4T type CMOS image sensor according to a first embodiment of the present invention.

Referring to FIG. 5, a p-well region 102 can be formed in a surface of a semiconductor substrate 101. In one embodiment, the semiconductor substrate 101 can be p-single crystal silicon. In an embodiment, the p-well region 102 can be formed by implanting p type impurity ions at a concentration lower than that of the semiconductor substrate 101. In another embodiment, the p-well region 102 can be formed by performing an epitaxial process to the semiconductor substrate 101.

The p-well region 102 allows a depletion region in the photodiode to be formed large and deep, and functions to increase the capability of a low voltage photodiode for collecting optical charges and enhances the photosensitivity.

In a specific embodiment, the p-well region 102 can be formed at a concentration range of $1E17/cm^3$ to $1E18/cm^3$.

Next, an active region and a device isolation region can be defined on the semiconductor substrate, and then a device isolation layer 103 can formed on the device isolation region using an STI or LOCOS technique.

Next, a gate insulating layer and a conductive layer (e.g., high concentration polysilicon layer) can be formed on an entire upper surface of the semiconductor substrate 101 including the device isolation layer 103. Then, the conductive layer can be selectively removed through a photolithography and etching process to form a gate electrode 105.

While the gate electrode 105 of the reset transistor is formed, the gate electrodes of other transistors, (i.e., the gate electrode 115 of the transfer transistor, the gate electrode 125 of the drive transistor, and the gate electrode 135 of the select transistor) can be formed at the same time.

Figure 6:
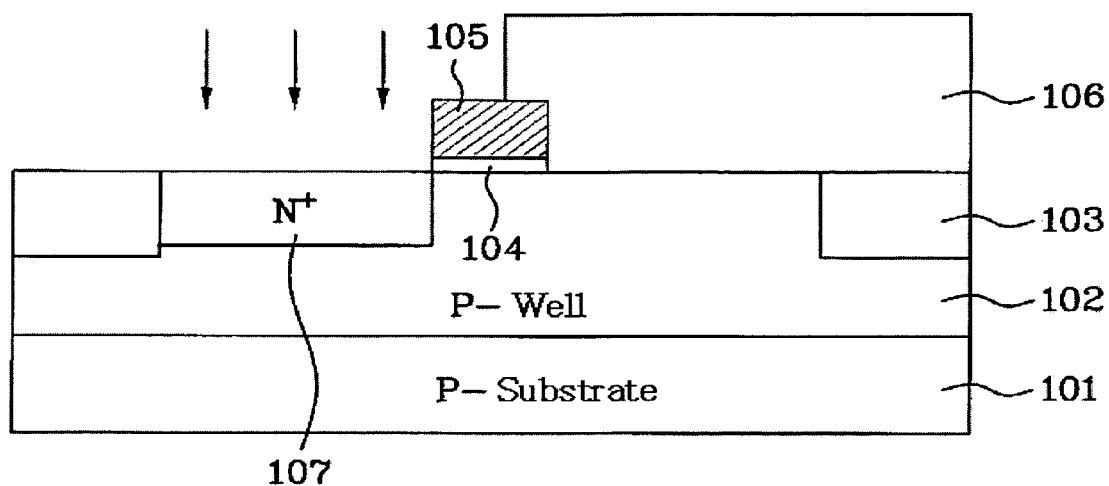

Thereafter, referring to FIG. 6, a first photoresist film 106 can be formed on an entire upper surface of the semiconductor substrate 101 including the gate electrode 105, and can be patterned through an exposure and development process to expose a portion of the active region not including both the floating diffusion region and the photodiode region.

Thereafter, a high concentration of n+ impurity ions can be implanted into the exposed active region using the patterned first photoresist film 106 as a mask to form a first n+ diffusion region 107. In a specific embodiment, the n+ diffusion region 107 can be formed at a concentration range of $1E20/cm^3$ to $1E22/cm^3$.

Figure 9:
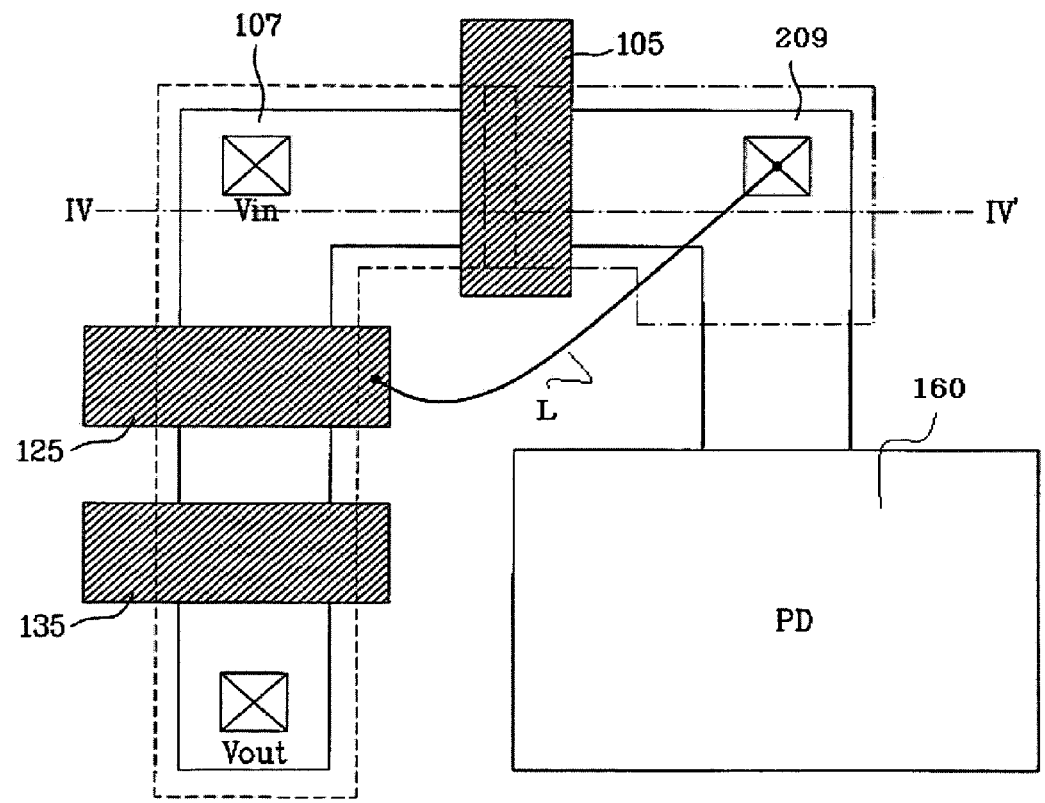
FIG. 9 is a layout of a unit pixel of a 3T type CMOS image sensor according to a second embodiment of the present invention.

That is, the n+ diffusion region 107 can be formed in the active region at one side of the gate electrode 105 of the reset transistor and at both sides of each of the gate electrode 125 of the drive transistor and the gate electrode 135 of the select transistor. In FIG. 9, a uniform dashed line indicates a region where the first n+ diffusion region can be formed.

Figure 7:
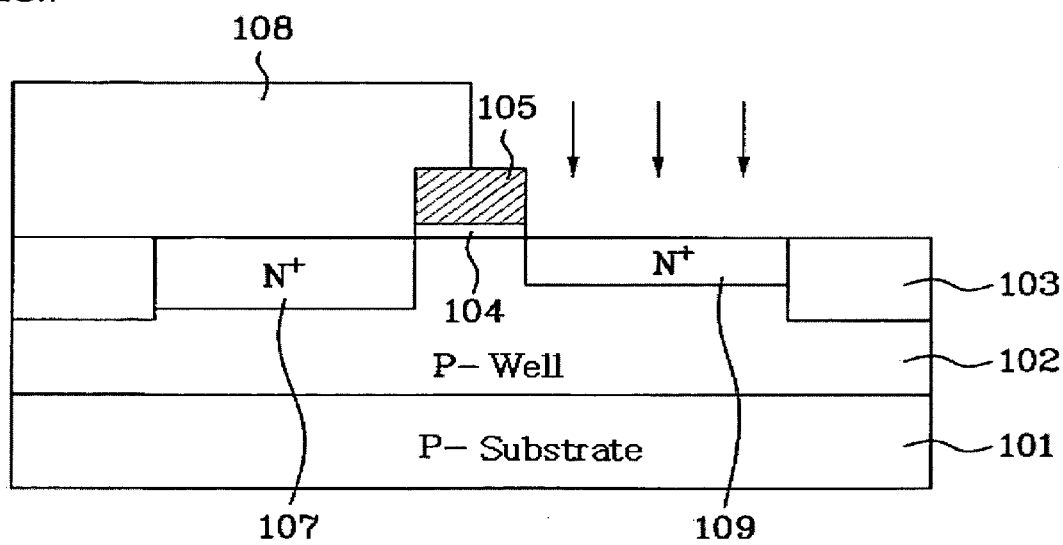

Next, referring to FIG. 7, after the first photoresist film 106 is removed, a second photoresist film 108 can be coated on an entire surface of the semiconductor substrate 101, and then patterned through an exposure and development process to define the floating diffusion region.

Thereafter, a high concentration of n+ impurity ions can be implanted into the exposed floating diffusion region using the patterned second photoresist film 108 as a mask to form a second n+ diffusion region (i.e., floating diffusion region) 109 having a lower concentration than the first n+ diffusion region 107.

Figure 8:
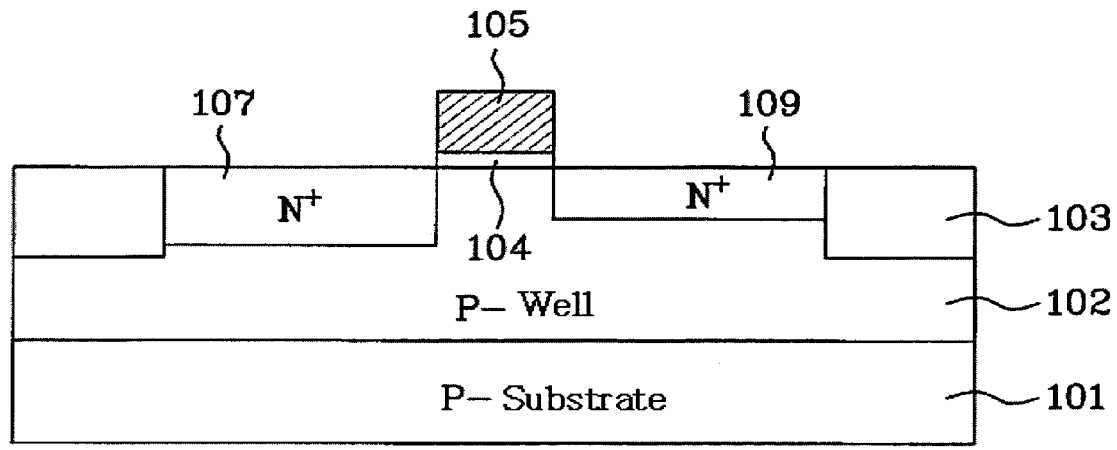

Next, referring to FIG. 8, after the second photoresist film 108 is removed, the semiconductor substrate 101 can be subjected to a thermal annealing (e.g., rapid thermal annealing) so that the impurity ions in the first n+ diffusion region 107 and the second n+ diffusion region 109 can be diffused.

The method for manufacturing the 4T type CMOS image sensor according to the first embodiment of the present invention is characterized in that the impurity concentrations of the first n+ diffusion region 107 and the second n+ diffusion region (i.e., floating diffusion region) 109 are made different from each other.

That is, the concentration of the first n+ diffusion region 107 formed at one side of the gate electrode 105 of the reset transistor in FIG. 8 is made different from that of the second n+ diffusion region 109 formed at the other side of the gate electrode 105, while the impurity concentration of the first n+ diffusion region 107 is made the same as that for both sides of the gate electrodes of the remaining transistors.

Accordingly, the concentration of the impurity ions in the floating diffusion region used as the common source or drain region for the reset transistor and the transfer transistor can be made lower than that of the other transistors, thereby decreasing the leakage current in the floating diffusion region to enhance the characteristic of the image sensor.

Second Embodiment

Figure 10:
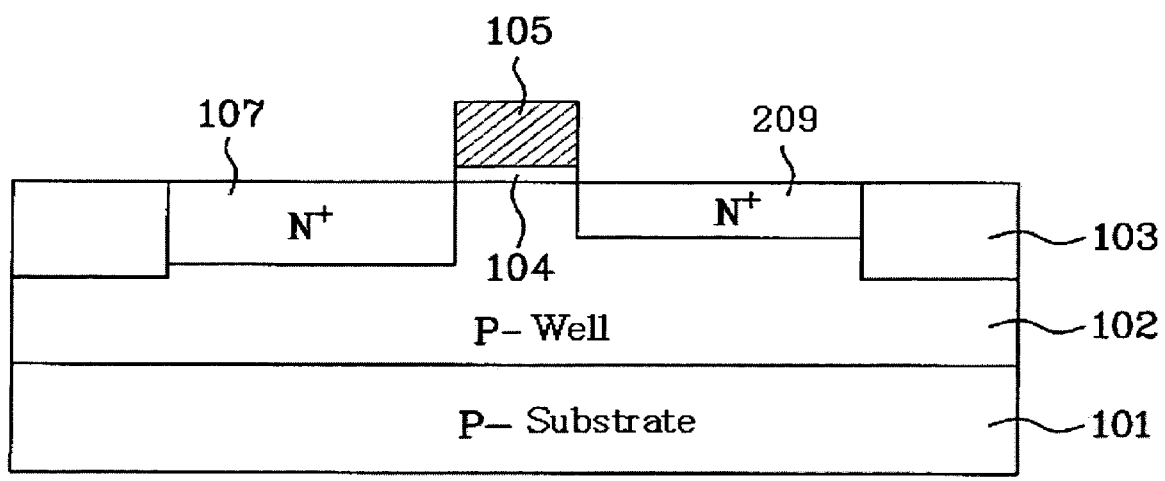
FIG. 10 is a sectional view taken along the line IV-IV' of FIG. 9.

FIG. 9 is a layout of a unit pixel of a 3T type CMOS image sensor according to a second embodiment of the present invention, and FIG. 10 is a sectional view taken along the line IV-IV' of FIG. 9.

As shown in FIG. 9, the 3T type CMOS image sensor according to the second embodiment of the present invention is a CMOS image sensor including one photodiode 160 and three transistors. The three transistors include a reset transistor, a drive transistor, and a select transistor.

The 3T type CMOS image sensor according to the second embodiment of the present invention can incorporate the elements mentioned in relation to the 4T type CMOS image sensor according to the first embodiment of the present invention.

Hereinafter, characteristic parts of the second embodiment of the present invention will be described.

In the 3T type CMOS image sensor according to the second embodiment of the present invention, a second conductive type first diffusion region 107 can be formed in a first region 107 of the active region. The first region 107 does not include a second region 209 between the reset transistor and the photodiode. The first region 107 also does not include the photodiode 'PD' region 160.

The second conductive type first diffusion region 107 can be an n+ diffusion region 107, and, in a specific embodiment, can be formed at a concentration range of $1E20/cm^3$ to $1E22/cm^3$.

Next, impurity ions can be implanted into the second region 209 at a concentration lower than that of the second conducive type first diffusion region 107 to form a second conductive type second diffusion region 209. The second conductive type second diffusion region 209 can be a second n+ diffusion region 209, and, in a specific embodiment, can be formed at a concentration range of $1E18/cm^3$ to $1E20/cm^3$.

That is, the 3T type image sensor and the method for manufacturing the 3T type CMOS image sensor according to the second embodiment of the present invention are characterized in that the impurity concentrations of the first n+ diffusion region 107 and the second n+ diffusion region (i.e., floating diffusion region) 209 are made different from each other.

That is, the concentration of the first n+ diffusion region 107 formed at one side of the gate electrode 105 of the reset transistor in FIG. 10 is made different from that of the second n+ diffusion region 109 formed at the other side of the gate electrode 105, while the impurity concentration of the first n+ diffusion region 107 is made the same as that for both sides of the gate electrodes of the remaining transistors.

In the method for manufacturing the 3T type CMOS image sensor according to the second embodiment of the present invention, the concentration of the impurity ions in the region between the reset transistor and the photodiode is made lower than that for the other transistors, thereby decreasing the leakage current to enhance the characteristic of the image sensor.

It will be apparent to those skilled in the art that various modifications and variations can be made in the present invention. Thus, it is intended that the present invention covers the modifications and variations of this invention provided they come within the scope of the appended claims and their equivalents.

I claim:

1. A method for manufacturing a CMOS image sensor having a photodiode, a transfer transistor, a reset transistor, a drive transistor and a select transistor, the method comprising:

forming a device isolation layer on a device isolation region of a first conductive type substrate in which an active region and the device isolation region are defined;

forming gate electrodes for the transfer transistor, the reset transistor, the drive transistor and the select transistor on the active region with gate insulating layers interposed therebetween;

forming a first diffusion region of a second conductive type in a first region of the active region; and forming a second diffusion region in a floating diffusion region between the transfer transistor and the reset transistor by implanting impurity ions only into the floating diffusion region at a concentration lower than that of the first diffusion region, wherein the first diffusion region of the second conductive type is not formed in the floating diffusion region and a photodiode region.

2. The method according to claim 1, wherein the first diffusion region is formed in the active region at one side of the gale electrode of the reset transistor and at both sides of the gate electrode of the drive transistor and the select transistor.

3. The method according to claim 2, wherein the second diffusion region is formed in the active region at the other side of the gate electrode of the reset transistor at a concentration lower than that of the first diffusion region.

4. The method according to claim 1, wherein the first diffusion region is formed at a concentration range of $1E20/cm^3$ to $1E22/cm^3$.

5. The method according to claim 1, wherein the second diffusion region is formed at a concentration range of $1E18/cm^3$ to $1E20/cm^3$.

6. A method for manufacturing a CMOS image sensor having a photodiode, a reset transistor, a drive transistor and a select transistor, the method comprising:

forming a device isolation layer on a device isolation region of a first conductive type substrate in which an active region and the device isolation region are defined;

forming gate electrodes for the reset transistor, the drive transistor and the select transistor on the active region with gate insulating layers interposed therebetween;

forming a first diffusion region in a first region of the active region; and forming a second diffusion region in a second region of the active region between the reset transistor and the photodiode by implanting impurity ions only into the second region at a concentration lower than that of the first diffusion region, wherein the first diffusion region is not formed in the second region.

7. The method according to claim 6, wherein the first diffusion region is formed in the active region at one side of the gate electrode of the reset transistor and at both sides of the gate electrode of the drive transistor and the select transistor.

8. The method according to claim 7, wherein the second diffusion region is formed in the active region at the other side of the gate electrode of the reset transistor at a concentration lower than that of the first diffusion region.

9. The method according to claim 6, wherein the first diffusion region is formed at a concentration range of $1E20/cm^3$ to $1E22/cm^3$.

10. The method according to claim 6, wherein the second diffusion region is formed at a concentration range of $1E18/cm^3$ to $1E20/cm^3$.

* * * * *